(12) United States Patent
Raben et al.

(10) Patent No.: US 11,527,451 B2
(45) Date of Patent: Dec. 13, 2022

(54) MOLDED AIR-CAVITY PACKAGE AND DEVICE COMPRISING THE SAME

(71) Applicant: Ampleon Netherlands B.V., Nijmegen (NL)

(72) Inventors: Leonardus Theodorus Maria Raben, Nijmegen (NL); Franciscus Gerardus Maria Meeuwsen, Nijmegen (NL); Jan Joseph Briones Miranda, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 0 days.

(21) Appl. No.: 17/339,300

(22) Filed: Jun. 4, 2021

(65) Prior Publication Data
US 2021/0384092 A1    Dec. 9, 2021

(30) Foreign Application Priority Data
Jun. 4, 2020    (NL) .................................... 2025749

(51) Int. Cl.
*H01L 23/057* (2006.01)
*H01L 23/08* (2006.01)
*H01L 23/00* (2006.01)

(52) U.S. Cl.
CPC ............ *H01L 23/057* (2013.01); *H01L 23/08* (2013.01); *H01L 24/48* (2013.01); *H01L 2224/48227* (2013.01)

(58) Field of Classification Search
CPC ....... H01L 23/057; H01L 23/08; H01L 24/48; H01L 2224/48227
See application file for complete search history.

(56) References Cited

U.S. PATENT DOCUMENTS

| | | | |
|---|---|---|---|
| 5,574,314 A | 11/1996 | Okada et al. | |
| 10,199,303 B1 | 2/2019 | Sanchez et al. | |
| 10,269,678 B1 | 4/2019 | Viswanathan et al. | |
| 2004/0011699 A1* | 1/2004 | Park ...................... | H01L 23/055 206/832 |
| 2008/0053700 A1* | 3/2008 | O'Connor ............ | B23K 20/122 174/564 |
| 2008/0266821 A1 | 10/2008 | Wetzel | |

OTHER PUBLICATIONS

Search Report and Written Opinion for Netherlands Patent Application No. NL 2025749, dated Feb. 12, 2021, 9 pages.

* cited by examiner

*Primary Examiner* — Peniel M Gumedzoe
(74) *Attorney, Agent, or Firm* — McDonnell Boehnen Hulbert & Berghoff LLP

(57) ABSTRACT

The present invention relates to a molded air-cavity package. In addition, the present invention is related to a device comprising the same. The present invention is particularly related to molded air-cavity packages for radio-frequency 'RF' applications including but not limited to RF power amplifiers.

Instead of using hard-stop features that are arranged around the entire perimeter of the package in a continuous manner, the present invention proposes to use spaced apart pillars formed by first and second cover supporting elements. By using only a limited amount of pillars, e.g. three or four, the position of the cover relative to the body can be defined in a more predictable manner. This particularly holds if the pillars are arranged in the outer corners of the package.

17 Claims, 13 Drawing Sheets

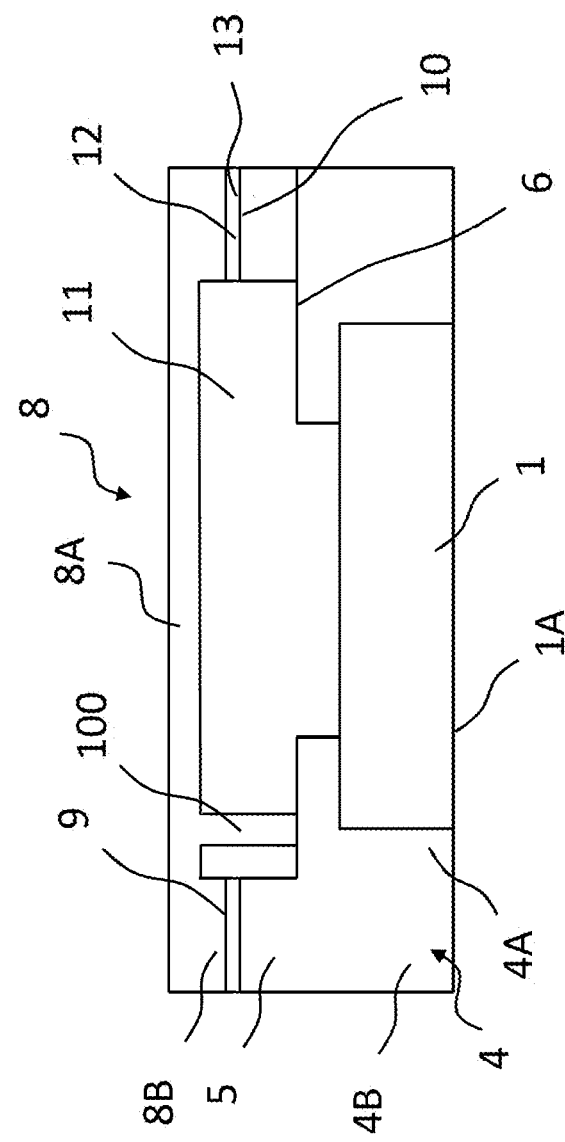

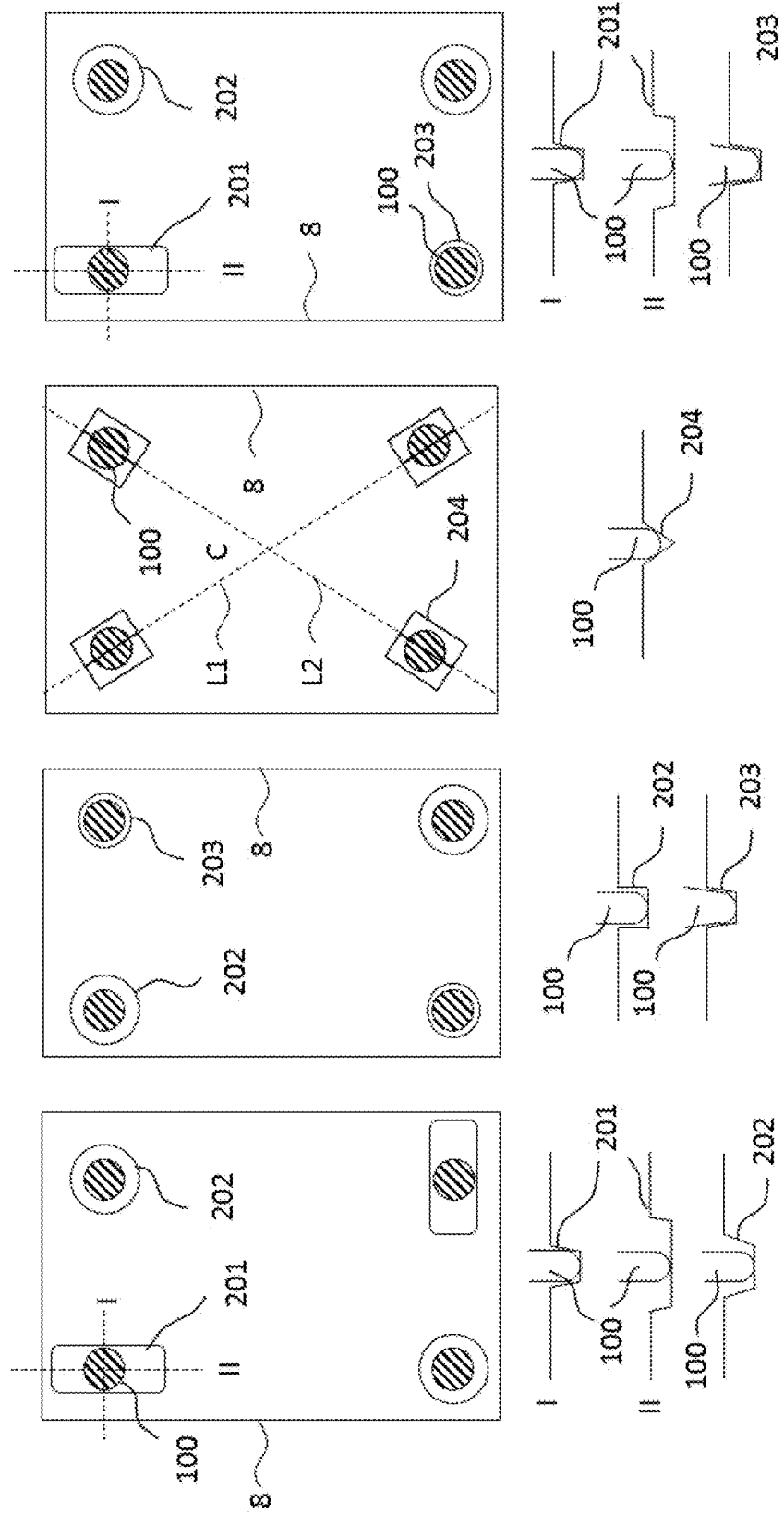

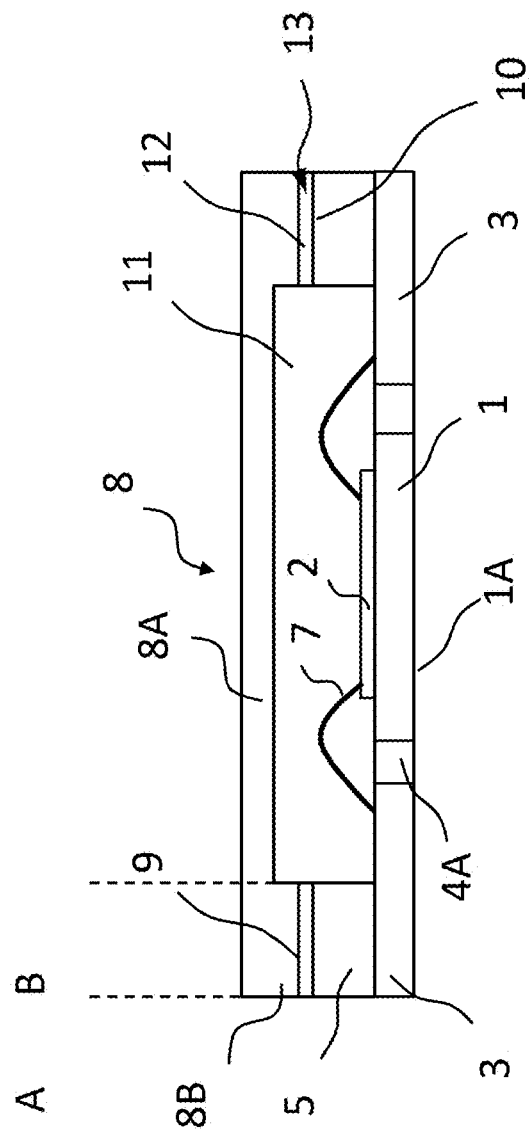
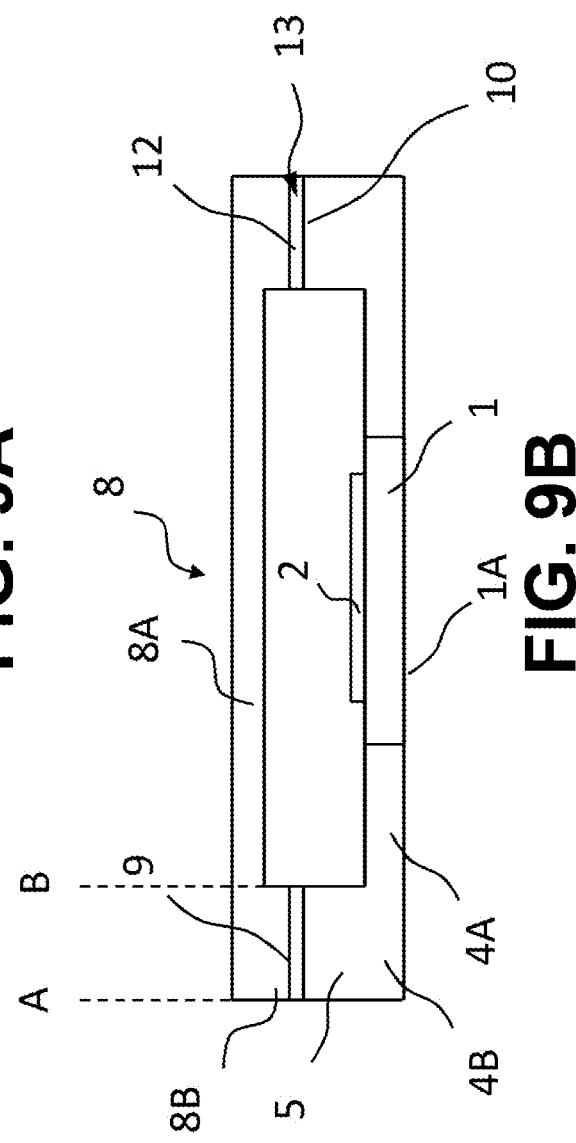

MOLDED AIR-CAVITY PACKAGE AND DEVICE COMPRISING THE SAME

CROSS-REFERENCE TO RELATED APPLICATIONS

The present application is a non-provisional patent application claiming priority to Netherlands Patent Application No. NL 2025749, filed Jun. 4, 2020, the contents of which are hereby incorporated by reference.

FIELD OF THE DISCLOSURE

The present invention relates to a molded air-cavity package. In addition, the present invention is related to a device comprising the same. The present invention is particularly related to molded air-cavity packages for radio-frequency 'RF' applications including but not limited to RF power amplifiers.

BACKGROUND

The general structure shown in FIG. 1, which is in accordance with the preamble of claim 1, is known from U.S. Pat. No. 10,199,303 B1. In addition to the features shown in FIG. 1, the embodiments of U.S. Pat. No. 10,199,303 B1 comprise hard-stop features defined in upper surface 10 of upper part 5 and in lower surface 9 of cover sidewall 8B. The position of these hard-stop features is illustrated in FIG. 1 using arrow 13. As stated before, upper surface 10 of upper part 5 and lower surface 9 of cover sidewall 8B define a channel 12 in which the adhesive for connecting cover 8 and the body is arranged. The hard-stop features abut each other thereby defining the package height and defining a volume of channel 12. Furthermore, the hard-stop features close off the channel to prevent adhesive from flowing out off the package. In U.S. Pat. No. 10,199,303 B1, it is asserted that, by defining a volume of channel 12, better control is possible of the amount of adhesive to be used to guarantee sufficient sealing.

In the embodiments of U.S. Pat. No. 10,199,303 B1, upper surface 10 of upper part 5 and lower surface 9 of cover sidewall 8B each further comprise angled surfaces (not shown in FIG. 1) that allow for self-alignment of cover 8 relative to the body during the process of attaching cover 8 to the body.

FIG. 2A illustrates a schematic top view of the package of FIG. 1 illustrating some boundaries between different materials. For example, line A marks the outside of the package, line B marks the inside surface of cover sidewall 8B and indicates the boundary between regions 4A and 4B, and line C marks the perimeter of heat-conducting substrate 1.

A drawback of the package from U.S. Pat. No. 10,199,303 B1 is related to the warpage that is typically present in the lower part of the package, e.g. the body. This problem is illustrated in FIG. 2B, which schematically illustrates a side view of the package in accordance with arrow D in FIG. 2A. Here, the lower part of the package is jointly referred to using reference sign 14. In practice, some warpage or twist may exist in lower part 14. As the hard-stop features of the known package extend around the entire perimeter of the package, placement of cover 8 could result in cover 8 being in an unpredictable tilted position relative to lower part 14. Such position may result in large gaps appearing between cover 8 and lower part 14. Such gaps may introduce a risk of air leakage thereby reducing the life-time of the package. In addition, the unpredictable position of cover 8 relative to lower part 14 may result in channel 12 having a capacity that varies over the package. This may at some positions result in too much adhesive being present in the channel, causing a risk of adhesive flowing inside the package, e.g. onto lead ends 3A, which may cause field rejects.

SUMMARY

Some of the embodiments of a molded air-cavity package according to the present invention have the structural features of the package that is schematically shown in FIG. 1. More in particular, some embodiments of a molded air-cavity package according to the present invention comprise a heat-conducting mounting substrate 1, for example in the form of a copper, aluminum, or other metal or alloy substrate. Alternatively, a laminated substrate, a printed circuit board, or a leadframe die-pad may be used. On heat-conducting mounting substrate 1 shown in FIG. 1, a semiconductor die 2 is mounted. Typically, a solder layer, a glue layer, or an Ag sinter layer (not shown) is used for mounting semiconductor die 2 on mounting substrate 1. It is further noted that flip-chip die attach techniques can be used for mounting semiconductor die 2. In such case, a printed circuit board can be used as mounting substrate on which semiconductor die 2 is flip-chipped.

The molded air-cavity package further comprises a plurality of package contacts in the form of leads 3, each lead 3 having a respective lead end 3A. Leads 3 are configured for transporting electrical signals in to and out of the molded air-cavity package. Leads 3 can be flat, as shown in FIG. 1, or leads 3 may have a bended shape, sometimes referred to as gull-wing leads.

Typically, a lower surface 1A of heat-conducting mounting substrate 1 is exposed on an outside surface of the molded air-cavity package. Exposed surface 1A can be physically connected to a ground plane on a printed circuit board on which the molded air-cavity package can be mounted. More in particular, exposed lower surface 1A allows heat and electrical current to pass through. It is noted that exposure of the lower surface may not apply when a die-pad is used as mounting substrate.

The molded air-cavity package of FIG. 1 also comprises a body of solidified molding compound that fixates the plurality of leads 3 relative to heat-conducting mounting substrate 1 in a spaced apart manner thereby electrically isolating the plurality of leads 3 from heat-conducting mounting substrate 1. The solidified molding compound can for example be a thermo-set material, such as Duroplast, or a thermo-plast such as liquid crystal polymers. To manufacture the molded air-cavity package, leads 3 and heat-conducting mounting substrate 1 are arranged in a mold while being kept at a predefined distance. Liquid molding compound will be added into the mold, either using injection molding or transfer molding techniques, after which the molding compound will solidify.

The body comprises a lower part 4 and an upper part 5 that is integrally connected to lower part 4. Here, it is noted that the wording upper and lower throughout this description will be used to indicate a position relative to lower surface 1A of heat-conducting mounting substrate 1. Similarly, when a die-pad is used as mounting substrate, a lower surface thereof could be used as a reference.

Lower part 4 has an inner region 4A and an outer region 4B relative to a center of the package. A boundary between regions 4A and 4B is indicated by dotted line B throughout the figures. Moreover, lower part 4 is fixedly connected to heat-conducting substrate 1 and leads 3. Upper part 5 forms a ring that is integrally connected to outer region 4B of lower part 4. The plurality of leads 3 extends through the body of solidified molding compound. Lead end 3A of each lead 3 is free of solidified molding compound and is supported on or embedded in a supporting surface 6 of inner region 4A of lower part 4. Typically, the upper surface of lead end 3A lies in plane with a remainder of supporting surface 6.

The molded air-cavity package further comprises bondwires 7 for connecting lead ends 3A to semiconductor die 2, or more particularly to one or more integrated circuits on semiconductor die 2.

The molded air-cavity package also comprises a cover 8 having a cover base 8A and a cover sidewall 8B protruding from an edge of cover base 8A towards upper part 5. A lower surface 9 of cover sidewall 8B is fixedly connected to an upper surface 10 of upper part 5 using an adhesive. In FIG. 1, the adhesive (not shown) is arranged in a channel 12 that is defined by upper surface 10 and lower surface 9. In this manner, the cover 8, the body of solidified molding compound and heat-conducting mounting substrate 1 define an air cavity 11 in which semiconductor die 2 is arranged.

Packages of the abovementioned type offer a relatively low cost solution compared to ceramic packages in which a ceramic ring is used to fixate the leads relative to the heat-conducting mounting substrate or die-pad. It is further noted that the wording air-cavity packages does not exclude embodiments wherein a gaseous mixture is present inside the cavity that is different from ambient air. Compared to packages in which an inside of the package is completely filled with molding compound, molded air-cavity packages have the advantage of increased RF performance due to the absence of dielectric losses inside a molding compound that would cover the semiconductor die and/or the bondwires.

An object of the present invention is to provide a molded air-cavity package in which the problems mentioned in the background section do not occur or at least to a lesser extent. According to the present invention, this object is achieved using the molded air-cavity package of claim 1 that is characterized in that the lower part has an inner region and an outer region relative to a center of the package, and in that the molded air-cavity package further comprises a plurality of separate first cover supporting elements being formed in one of the inner region and the cover base, and a plurality of separate second cover supporting elements being formed in the other of the inner region and the cover base, wherein each first cover supporting element extends towards and abuts a respective second cover supporting element thereby forming a respective pillar arranged spaced apart from the upper part and cover sidewall.

Instead of using hard-stop features that are arranged around the entire perimeter of the package in a continuous manner, the present invention proposes to use spaced apart pillars formed by first and second cover supporting elements. By using only a limited amount of pillars, e.g. three or four, the position of the cover relative to the body can be defined in a more predictable manner. This particularly holds if the pillars are arranged in the outer corners of the package. In addition, by arranging the first and second cover supporting elements not in the upper surface of the upper part or the lower surface of the cover sidewall, but in the cover base or the inner region a more reliable definition of the cover supporting elements can be realized. More in particular, the Applicant has found that the manufacturing tolerances for the cover base and the inner region are less than those of the lower surface of the cover sidewall and the upper surface of the upper part. Additionally, by arranging the hard-stop features away from the upper surface and the cover sidewall, more area is available for arranging the adhesive, thereby improving the reliability of the seal.

The upper surface of the upper part and the lower surface of the cover sidewall may together define a channel in which the adhesive is arranged. Such channel may start in the cavity and exit on an outer surface of the package. Furthermore, the adhesive blocks the channel thereby providing an airtight seal of the package. The channel may extend around the perimeter of the molded air-cavity package. Furthermore, the abovementioned lower surface of the cover sidewall and the abovementioned upper surface of the upper part preferably do not abut each other but are only connected using the intermediate adhesive. In this manner, the alignment of the cover relative to the body in the final position of the cover is solely obtained using the first and second cover supporting elements.

The channel, when seen from the inside of the cavity, preferably widens towards the exit of the channel. The purpose of such widening is to urge the adhesive inside the channel, during the process of attaching the cover to the body, to flow outwardly relative to the center of the molded air-cavity package. In this manner, a situation can be prevented in which adhesive flows into the cavity.

The cover can be made from the same or a different molding compound as the body. For example, the molding compound of the body and/or of the cover may comprise a thermo-set compound, such Duroplast, or a thermo-plast compound, such as liquid crystal polymers.

The body may fixate the plurality of package contacts relative to the mounting substrate in a spaced apart manner thereby electrically isolating the plurality of package contacts from the mounting substrate, and wherein the upper part may form a ring that is integrally connected to the outer region of the lower part. Furthermore, the package contacts may each comprise a lead and the package contact ends may each comprise a lead end, wherein the plurality of leads extend through the body of solidified molding compound, wherein each lead end is supported on or embedded in a supporting surface of the inner region of the lower part. The molded air-cavity package may further comprise bondwires for connecting the lead ends to the semiconductor die. In this case, the plurality of separate first cover supporting elements are formed in one of the supporting surface of the inner region and the cover base, and the plurality of separate second cover supporting elements are formed in the other of the supporting surface of the inner region and the cover base.

The supporting surface may comprise, for each lead, a recess in which the respective lead is at least partially accommodated. Typically, during the molding process, the lead ends are pressed onto by a mold. At positions where no leads are present, molding compound will be arranged. Consequently, in some embodiments, an upper surface of each lead will lie in plane with a remainder of the supporting surface.

At least one, and preferably all, of the first cover supporting elements can be formed in the supporting surface of the inner region and can be integrally connected to the body, and the corresponding second cover supporting element can be formed in the cover base and can be integrally connected thereto. Furthermore, the cover base may have a quadrangle shape, such as a square or rectangle, and some of the second cover supporting elements may be formed in respective corners of the cover base spaced apart from the cover sidewall. Additionally, the plurality of second cover supporting elements may comprise three second cover supporting elements each arranged in a respective corner of the cover base, and preferably four.

Alternatively, at least one of the second cover supporting elements can be formed in the supporting surface of the inner region and can be integrally connected to the body, and the corresponding first cover supporting element can be formed in the cover base and can be integrally connected thereto. Furthermore, the cover base may have a quadrangle shape and some of the first cover supporting elements can be formed in respective corners of the cover base spaced apart from the cover sidewall. Additionally, the plurality of first cover supporting elements may comprise three first cover supporting elements each arranged in a respective corner of the cover base, and preferably four.

Each second cover supporting element can be formed by a non-recessed and non-protruding region of the supporting surface of the inner region or by a non-recessed and non-protruding region of the cover base. Such non-recessed and non-protruding region is preferably flat.

The package contacts may each comprise a signal pad of which an inward surface forms a respective package contact end. In this case, the molded air-cavity package may further comprise bondwires for connecting the inward surfaces of the signal pads to the semiconductor die. Such package can be a quad flat no-lead package, a power quad flat no-lead package, or a dual flat no-lead package. In such or other package, the mounting substrate can be a die-pad and/or may provide thermal and electrical contact between the circuits on the semiconductor die and a ground plane on the printed circuit board onto which the package is mounted. Alternatively, a heat-conducting substrate such as a copper or copper based substrate can be used in such or other package.

Alternatively, the molded air-cavity package can be a land grid array package, wherein the mounting substrate comprises a printed circuit board, wherein the package contacts each comprise a respective land formed on an outside surface of the printed circuit board. In this case, the package contacts each further comprise a pad formed on an inside surface of the printed circuit board that forms a respective package contact end. The semiconductor die can be flip-chipped onto the printed circuit board using the pads formed on the inside surface of the printed circuit board. Alternatively, the molded-air cavity package further comprises bondwires for connecting the package contact ends to the semiconductor die.

Each second cover supporting element may extend towards and abut a respective first cover supporting element for together forming a respective pillar. In this embodiment, both the first cover supporting elements and the second cover supporting elements are pillar shaped.

Alternatively, each second cover supporting element may comprise a recess in which the corresponding first cover supporting element is received.

For example, the plurality of second cover supporting elements may comprise at least three second cover supporting elements, wherein a shape of the recess of two among the at least three second cover supporting elements limited relative movement between the cover and body to mutually different directions parallel to the mounting substrate during placement of the cover on the body. The recesses of the second cover supporting elements may for example comprise one of a groove and an elongated slot. The remaining second cover supporting elements need not have a limiting function of the relative movement.

Alternatively, the plurality of second cover supporting elements may comprise at least three second cover supporting elements, wherein a recess of two among the at least three second cover supporting elements has a shape that is complementary to the shape of the corresponding first cover supporting element such that relative movement between the cover and body was limited in all directions parallel to the mounting substrate during placement of the cover on the body.

The upper surface of the upper part may comprise one or more first alignment structures and the lower surface of the cover sidewall may comprise one or more second alignment structures, wherein the first and second alignment structures are configured to cooperate during placement of the cover on the body for urging the cover and the body to mutually move towards a position in which the first and second cover supporting elements abut each other. The one or more first and second alignment structures can be configured to perform a coarse alignment during which there is physical contact between the first and second alignment structures. Thereafter, the cover and the body may be mutually moved to bring the cover and body into a position in which the first and second cover supporting elements are aligned and abut each other and in which the first and second alignment structures are no longer in direct physical contact. The first and second alignment structures may at least partially form a wall of the aforementioned channel. For example, the first alignment structures may comprise a recess in the upper surface of the upper part and the second alignment structures may comprise a corresponding protrusion extending towards the recess in the upper surface of the upper part, or vice versa. Additionally or alternatively, the first and second alignment structures may comprise matching angled surfaces that extend upwardly and outwardly relative to the center of the package and the lower surface of the heat-conducting substrate.

The mounting substrate may comprise a heat-conducting substrate. In this latter case, the semiconductor die may comprise a conductive silicon substrate on which a laterally diffused metal-oxide-semiconductor, 'LDMOS', transistor is arranged, and grounding of the LDMOS transistor can be achieved through the silicon substrate and through the heat-conducting substrate. Alternatively, the semiconductor may comprise an insulating gallium nitride substrate on which a field-effect transistor, 'FET', is arranged, and grounding of the FET can be achieved through vias in the gallium nitride substrate and through the heat-conducting substrate. The LDMOS transistor or FET can form part of a Doherty amplifier. Here, it is noted that an insulating gallium nitride substrate also comprises insulating gallium nitride epitaxial layers grown on an insulating substrate such as silicon, silicon carbide, or sapphire.

Furthermore, the invention is not limited to a single semiconductor die. Rather, multiple semiconductor dies can be mounted on the same or different heat-conducting substrates or die-pads.

According to a further aspect, the present invention provides an electronic device comprising the molded air-cavity package as defined above. Such device may comprise a base station or base station transmitter for mobile telecommunications, or a solid state cooking device.

BRIEF DESCRIPTION OF THE DRAWINGS

Next, the present invention will be described in more detail referring to the appended figures, wherein:

FIGS. 3A and 3B illustrate two respective cross-sectional views of an embodiment of a molded air-cavity package according to the present invention;

FIGS. 4A-4D illustrate four different possibilities for arranging pillars in accordance with the present invention;

FIGS. 9A-9C illustrate a detailed embodiment of a molded air-cavity package in accordance with the present invention that is of the QFN, PQFN, or DFN type.

DETAILED DESCRIPTION

Figure 3A:
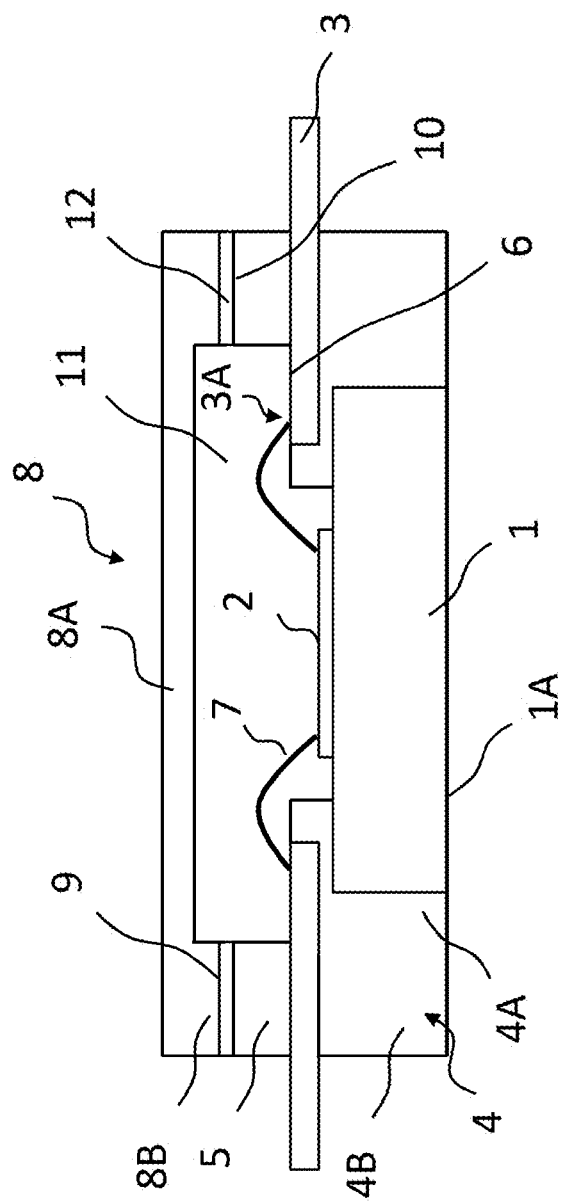

FIGS. 3A and 3B illustrate two respective cross-sectional views of an embodiment of a molded air-cavity package according to the present invention. More in particular, FIG. 3A illustrates a cross-sectional view at a position of a lead 3. Compared to the general structure of FIG. 1, the embodiment in FIG. 3A comprises a pillar 100 arranged in a corner of the package. This pillar is shown in FIG. 3B.

FIG. 3B illustrates a cross-sectional view at a position of pillar 100. As shown, pillar 100 extends from cover base 8A downwards and abuts supporting surface 6. Supporting surface 6 in FIG. 3B lies in plane with an upper surface of lead end 3A in FIG. 3A.

In the embodiment shown in FIG. 3B, the first cover supporting element is formed by the pillar like protrusion, whereas the second cover supporting element is formed by a flat portion of supporting surface 6.

Although FIGS. 3A and 3B illustrate a single pillar 100, it is noted that the present invention particularly relates to embodiments having four pillars, each arranged in a respective corner of the package. However, the present invention is not limited to four pillars as embodiments with more or less pillars, such as three, are equally possible.

FIGS. 4A-4D illustrate four different possibilities for arranging pillars in accordance with the present invention although more possibilities are not excluded. In these embodiments, first cover supporting elements 100, having a pillar shape, extend downward from cover base 8. First cover supporting elements 100 may have any shape and can be embodied as a cylinder or a bar. Furthermore, the downward facing end of first cover supporting element 100 may be tapered, rounded, and/or chamfered.

The embodiment shown in FIG. 4A comprises four first cover supporting elements 100, each arranged in a respective corner of cover base 8A and offset from cover sidewall 8B. Supporting surface 6 of upper part 4 comprises four recesses 201, 202 in which first cover supporting elements 100 are received. As shown in FIG. 4A, recesses 201 have an elongated shape in which movement of first cover supporting element 100 is restricted to one dimension. For example, recess 201, shown in the upper left corner, limits movement of first cover supporting element 100 to a different direction than recess 201 shown in the lower right corner. The shape of recesses 201 along two different lines, i.e. line I and II, is indicated in the bottom part of FIG. 4A.

Alignment of cover 8 relative to the body is achieved by recesses 201 that limit movement of cover 8 in two orthogonal directions that are both parallel to lower surface 1A of heat-conducting substrate 1. Recesses 202 need not have a strong limiting effect on the mutual movement between the body and cover 8. However, the abutment between first cover supporting elements 100 and recesses 201, 202 determines how cover 8 is positioned relative to the body in the direction perpendicular to lower surface 1A of heat conducting substrate 1.

FIG. 4D illustrates an alternative to FIG. 4A, wherein one elongated recess 202 is replaced by a recess 203 that has a shape that is complementary to that of first cover supporting element 100. For example, both the shape and sizes of recess 203 and that of first cover supporting element 100 can be similar to yield a tight fit. The other recesses 202 may have a looser fit.

FIG. 4B illustrates a different embodiment in which two recesses 203 have a shape that is complementary to that of first cover supporting element 100 both in shape and size. Recesses 202 have a much wider shape and are not or not as much involved in the alignment of cover 8 relative to the body in the directions parallel to lower surface 1A.

FIG. 4C illustrates how second cover supporting elements may take the form of a recess shaped as a V-groove in which first cover supporting elements 100 are received. The grooves of diametrically opposed second cover supporting elements 204 are aligned. The center lines L1, L2 that pass through diametrically opposed second cover supporting elements 204 preferably cross at a center position C in the package.

Figure 5:
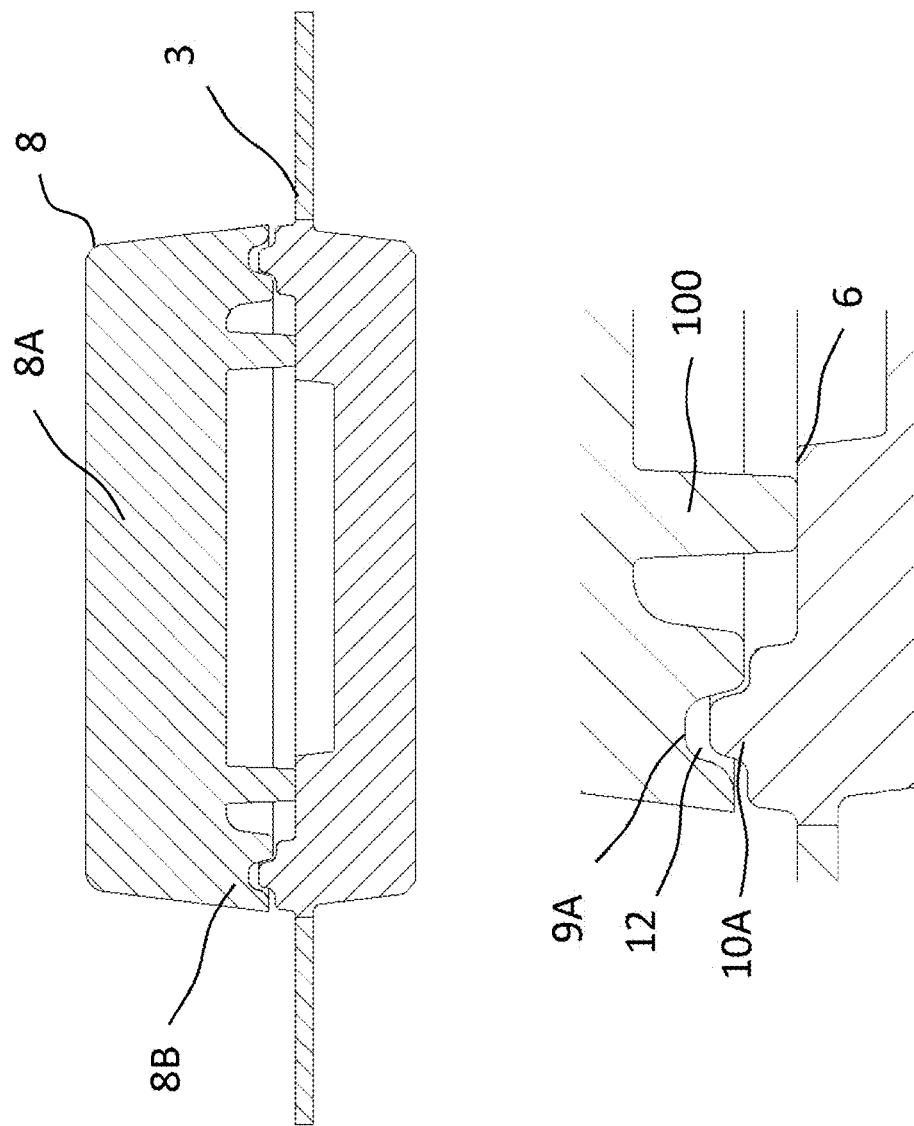
FIG. 5 illustrates a first detailed embodiment of a molded air-cavity package in accordance with the present invention.

FIG. 5 illustrates a cross-sectional view of a first detailed embodiment of a molded air-cavity package according to the present invention taken at a corner of the package. As shown in the detailed view on the bottom, first cover supporting elements 100 are pillar shaped, are integrally connected with cover base 8A, and abut a flat portion of supporting surface 6. In addition, lower surface 9 and upper surface 10 are provided with alignment structures. More in particular, lower surface 9 comprises a recess 9A and upper surface 10 a protrusion 10A that extends partially in recess 9A. Together, upper surface 10 and lower surface 9 define a channel 12 in which the adhesive (not shown) for fixedly connecting cover 8 to the body is arranged. As shown, channel 12 widens in a direction from the cavity to outside of the package. Consequently, liquid adhesive in channel 12 will tend to flow in an outward direction as the flow resistance for such flow is less than flow in an inward direction. Consequently, there is a reduced risk of liquid adhesive flowing into the cavity.

As shown, when cover 8 is properly aligned, recess 9A and protrusion 10A are not in physical contact. However, during the initial stages of aligning cover 8, when the adhesive has not yet fully spread across channel 12, recess 9A and protrusion 10A could be in physical contact for a course alignment.

Figure 6:
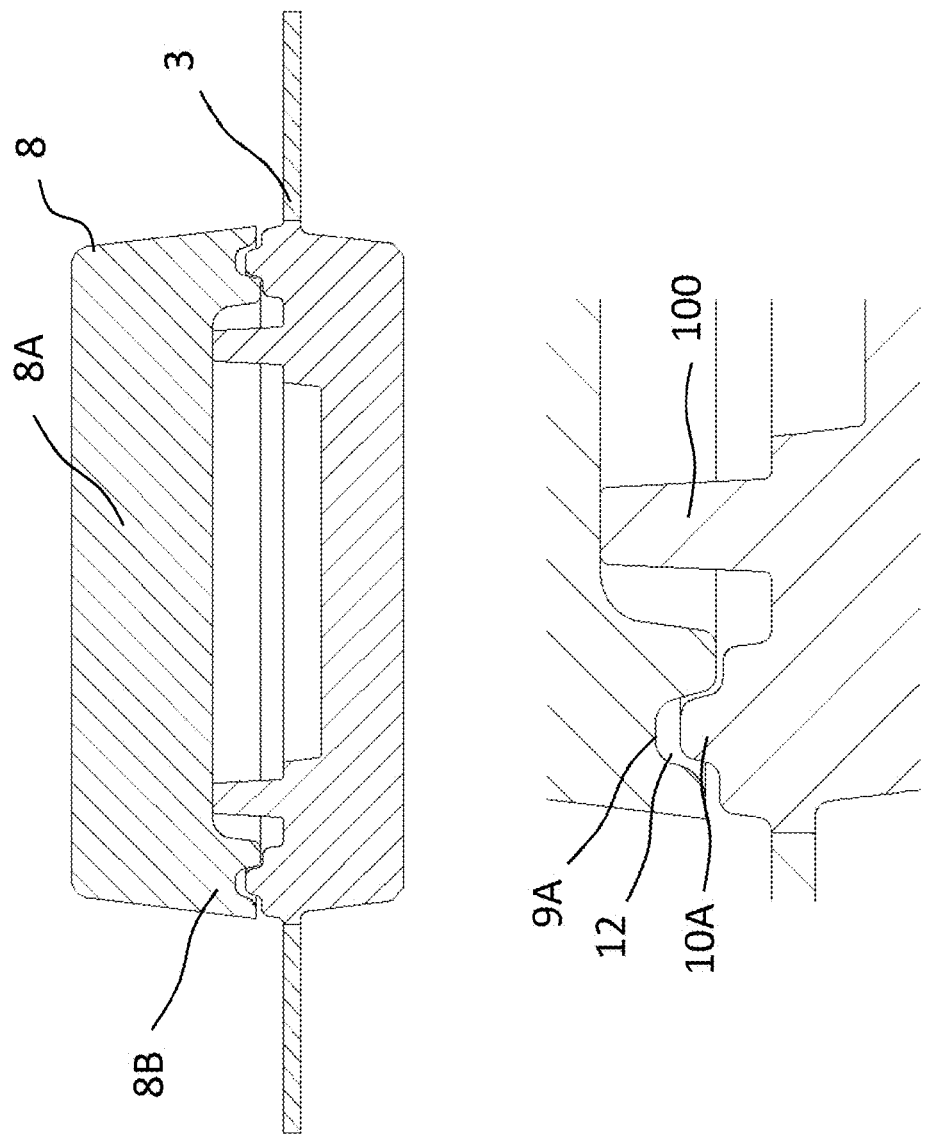
FIG. 6 illustrates a second detailed embodiment of a molded air-cavity package in accordance with the present invention.
Figure 7:
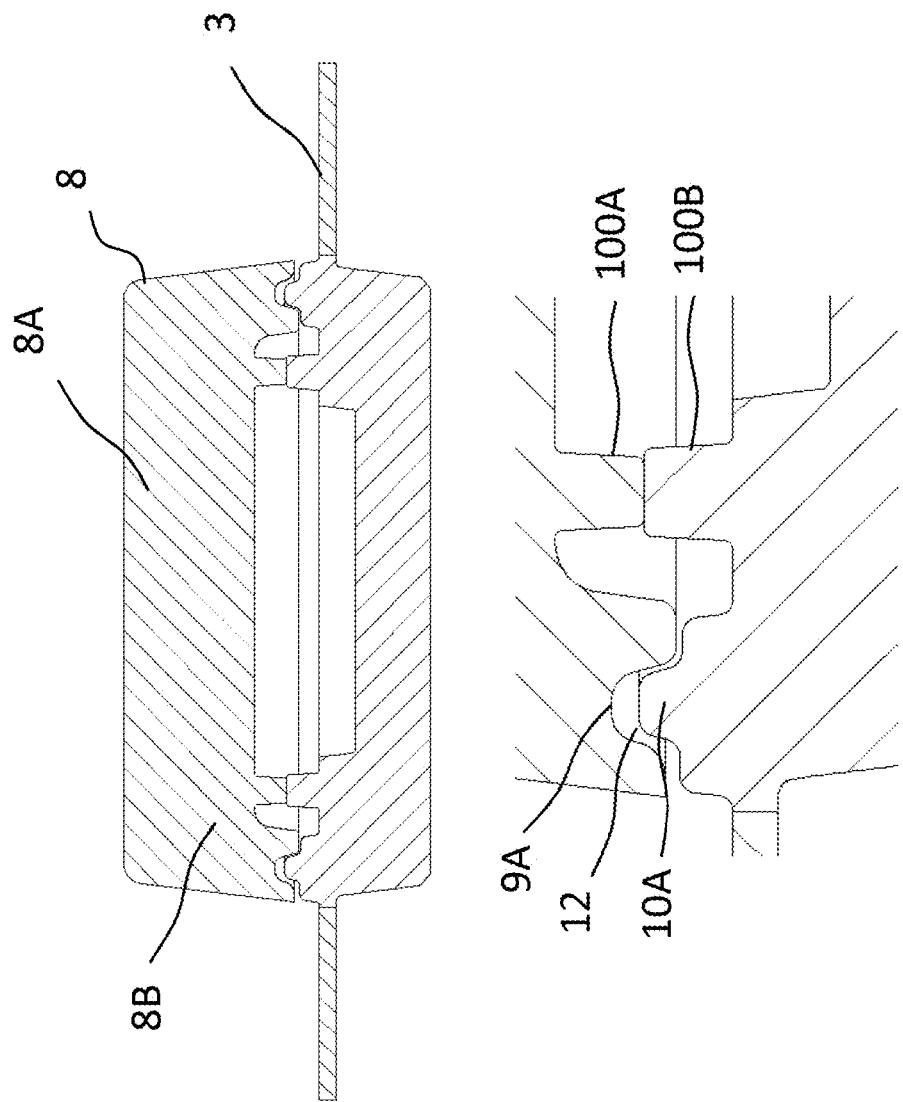
FIG. 7 illustrates a third detailed embodiment of a molded air-cavity package in accordance with the present invention.
Figure 8:
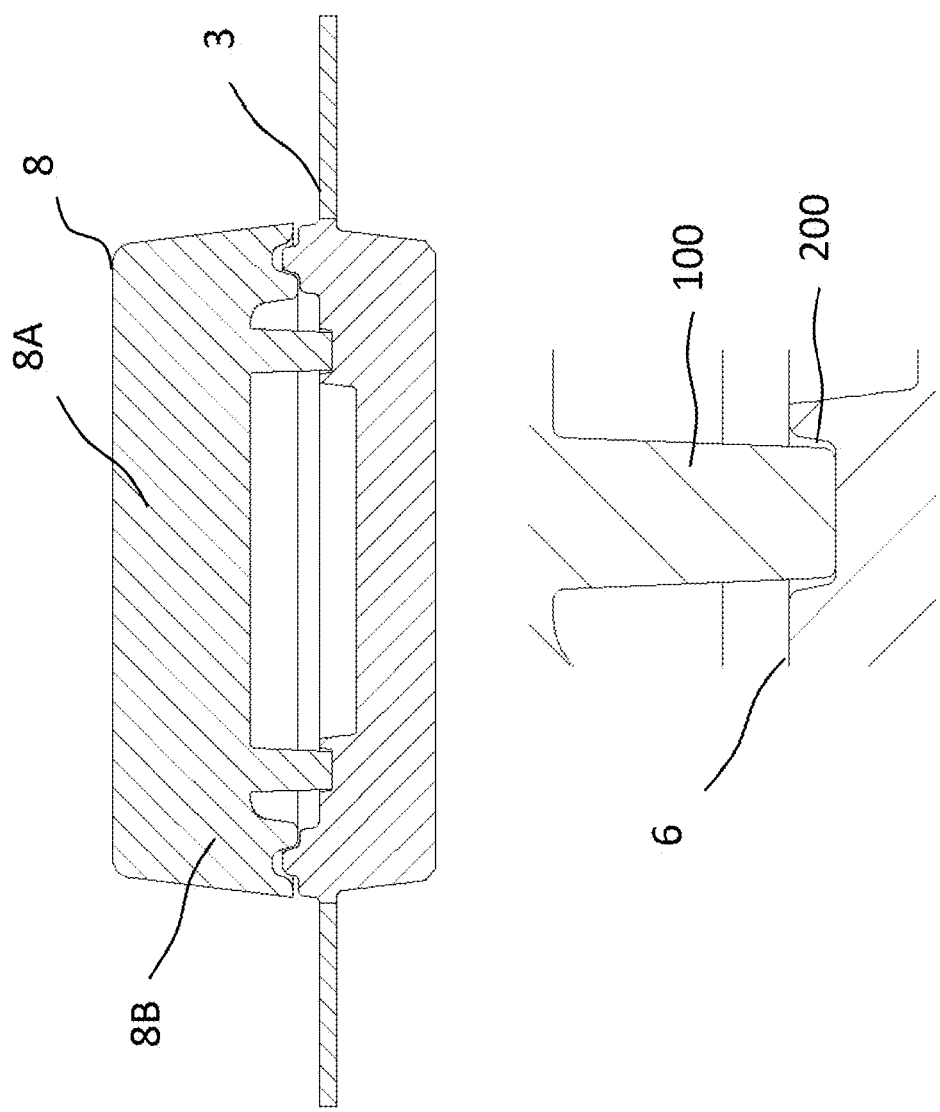
FIG. 8 illustrates a fourth detailed embodiment of a molded air-cavity package in accordance with the present invention.

FIGS. 6-8 illustrate different embodiments, which, when compared to FIG. 5, differ in the manner in which first cover supporting elements and second cover supporting elements are realized. In FIG. 6, supporting surface 6 comprises a pillar 100 that extends towards cover base 8A. More in particular, pillar 100 abuts a flat portion of cover base 8A, which latter portion forms a second cover supporting element. On the other hand, in FIG. 7, a pillar 100A extends from base cover 8A and supporting surface 6 comprises a pillar 100B that extends towards pillar 100A. When properly aligned, protrusions 100A, 100B form a single pillar.

Figure 1:
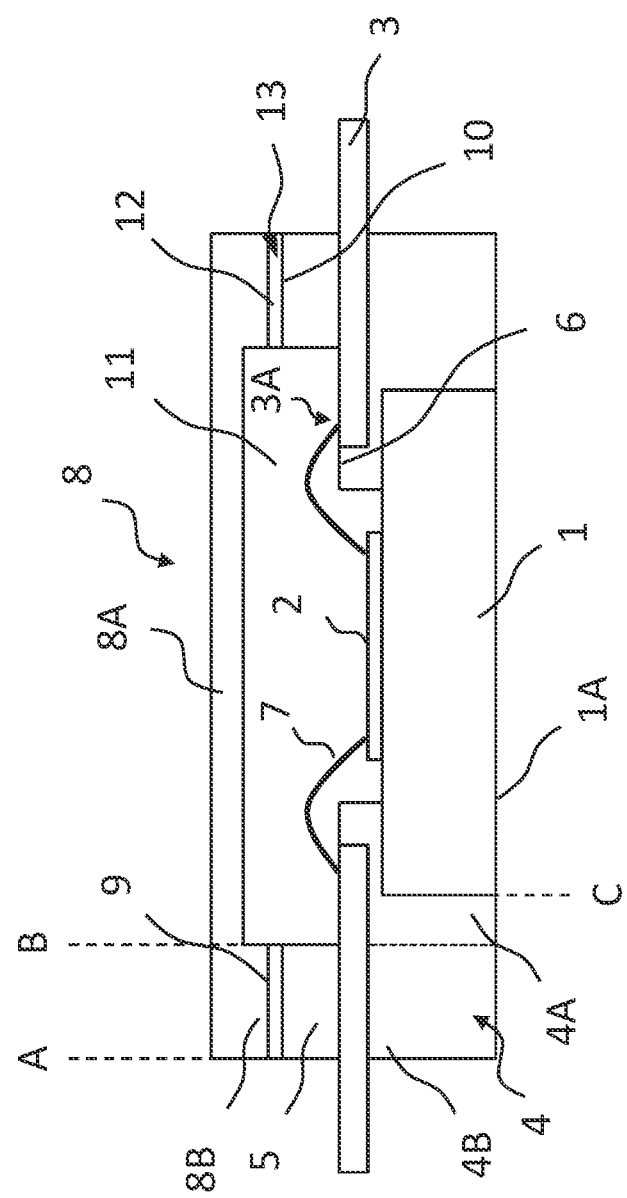
FIG. 1 illustrates a general structure of a molded air-cavity package.
Figure 2A:
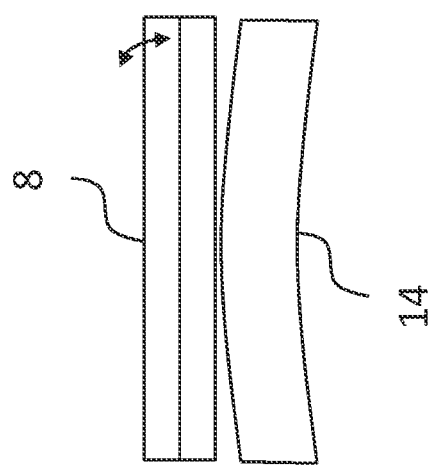
FIGS. 2A and 2B illustrate a generic top view and side view of the package of FIG. 1, respectively.
Figure 2B:
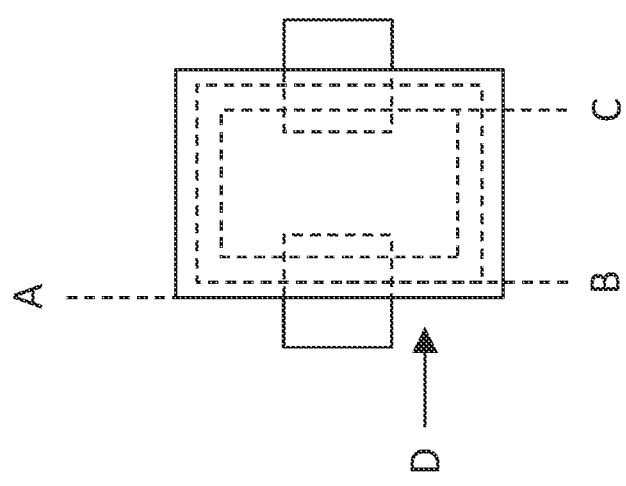

Although FIGS. 5-8 have shown embodiments in which lower surface 9 of cover sidewall 8B comprises a recess 9A and in which upper surface 10 of upper part 4 comprises a protrusion 10A, it should be appreciated that differently shaped channel-defining structures would equally be possible, for example parallel surfaces as illustrated in FIG. 1. Furthermore, the present invention equally relates to embodiments in which upper surface 10 is provided with a recess and lower surface 9 with a protrusion.

Figure 9C:
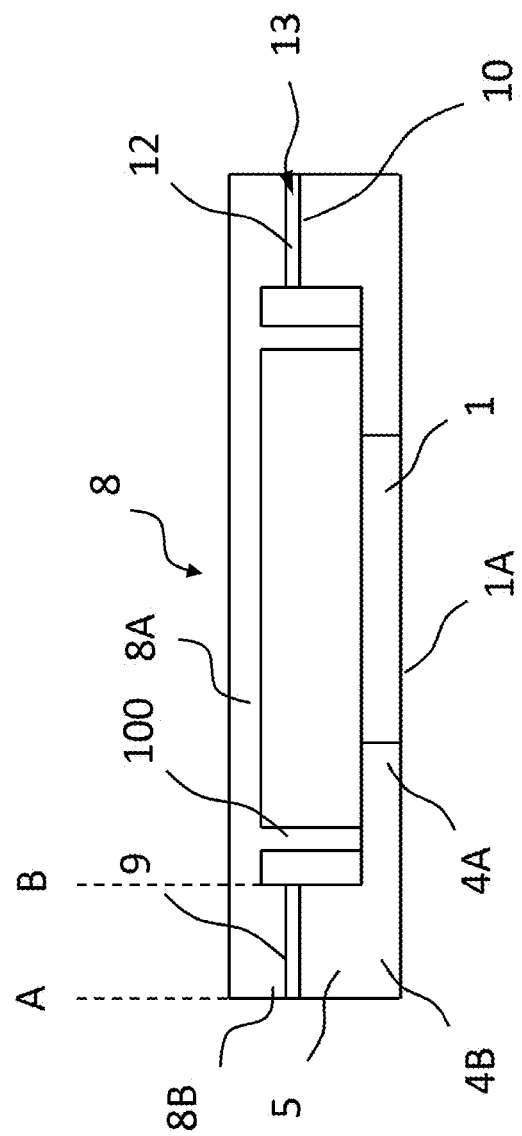

FIGS. 9A-9C illustrate a detailed embodiment of a molded air-cavity package in accordance with the present invention that is of the QFN, PQFN, or DFN type. In this case, a die-pad 1 is used as mounting substrate on which semiconductor die 2 is mounted. Die-pad 1 is fixedly connected to signal pads 3 by a solidified molding compound 4A. The cross-sectional view presented in FIG. 9A is at a position in which signal pads 3 are present, whereas the cross-sectional view presented in FIG. 9B is at a position in which signal pads 3 are not present.

A distinction can again be made between an inner region 4A and an outer region 4B of lower part 4 of the body, wherein outer region 4B is fixedly connected to upper part 5.

FIG. 9C presents a cross-sectional view at the position of a pillar 100 formed in cover base 8A. Pillar 100 abuts an upper surface of inner region 4A.

Figure 10A:
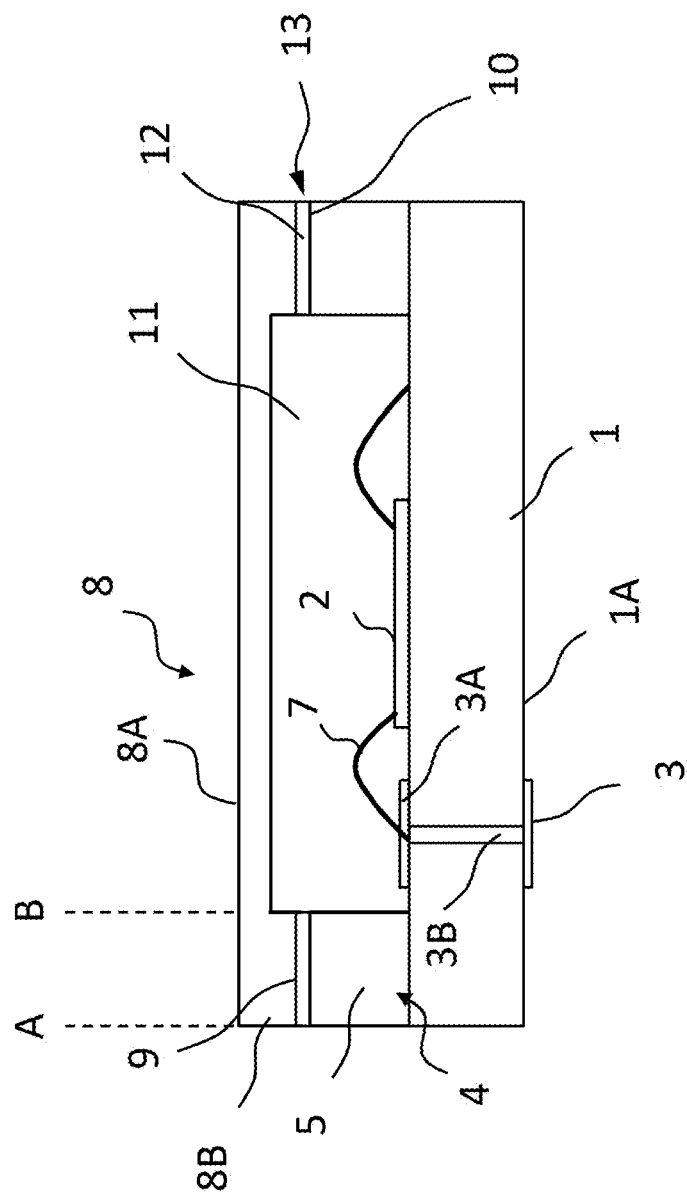
FIGS. 10A-10B illustrate a detailed embodiment of a molded air-cavity package in accordance with the present invention that is of the LGA type.
Figure 10B:
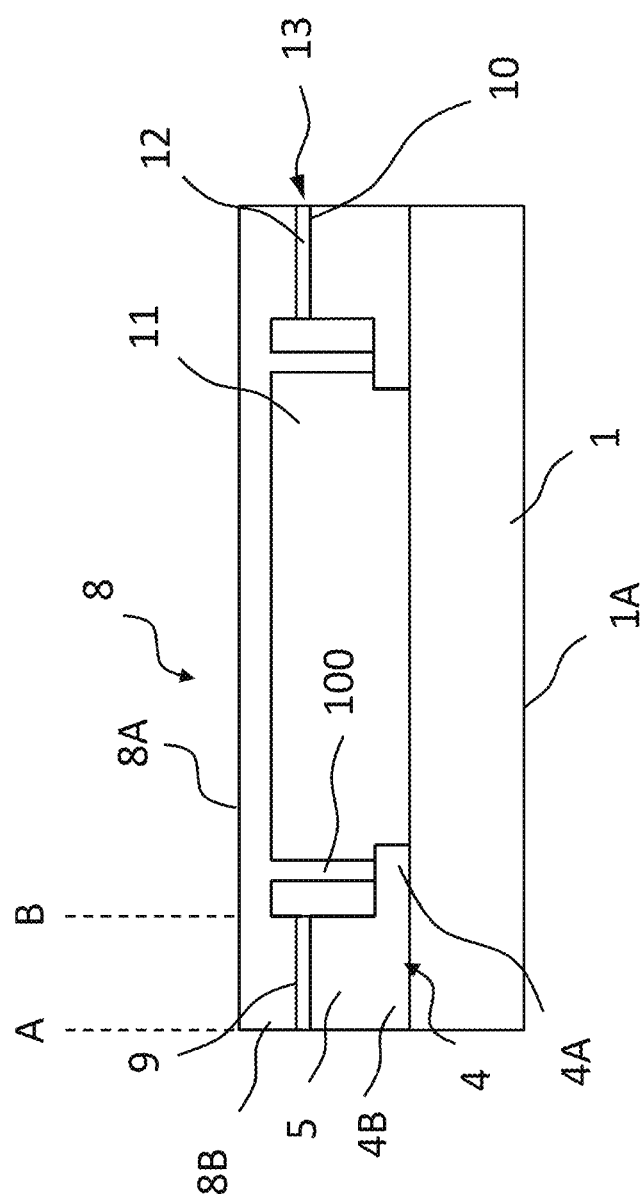

FIGS. 10A-10B illustrate a detailed embodiment of a molded air-cavity package in accordance with the present invention that is of the LGA type. In this embodiment, mounting substrate is formed by a printed circuit board 1 of which on an outward surface a plurality of lands are formed for mounting the package on for example a further printed circuit board. In FIG. 10A, a single land 3 is shown that is connected to a pad 3A on an inward surface of printed circuit board 1. Land 3 and pad 3A are connected using a via 3B. Bondwires 7 are used for electrically connecting each of the lands 3 to circuitry on semiconductor die 2. It should be understood that the package may comprise many more lands 3 formed on the outward surface of the printed circuit board. Furthermore, printed circuit board 1 may comprise a coin or other heat conducting material inside printed circuit board for improving the thermal contact between semiconductor 2 and a further printed circuit board on which the package is mounted.

FIG. 10B presents a cross-sectional view at a position of pillars 100. As shown, pillar 100 is supported on an upper surface of an inner region 4A of lower part 4. Embodiments are possible in which pillar 100 is supported on an upper surface of printed circuit board 1.

It is noted that embodiments are also possible in which semiconductor 100 is flip-chipped onto printed circuit board 1 instead of using bondwires 7.

In the above, the present invention has been explained using detailed embodiments thereof. However, the present invention is not limited to these embodiments. Rather, different modifications to these embodiments are possible without deviating from the scope of the present invention which is defined by the appended claims and their equivalents.

For example, at least some of the abovementioned advantages can equally be obtained when using a closed rim instead of the spaced apart pillars that are formed by the first and second cover supporting elements. This rim can be thought of as plurality of pillars that are adjacently arranged and integrally connected.

A molded air-cavity package in which a closed rim is used instead of spaced apart pillars could be configured as defined in the preamble of claim 1 and could further be characterized in that the molded air-cavity package comprises a first cover supporting element being formed in one of the inner region and the cover base, and a second cover supporting element being formed in the other of the inner region and the cover base, wherein the first cover supporting element extends towards and abuts the second cover supporting element thereby forming a closed rim arranged spaced apart from the upper part and cover sidewall.

Further advantageous embodiments described in the dependent claims in connection with the spaced apart pillars may be modified to include the closed rim. For example, the second cover supporting element may comprise a recess in which the first cover supporting element is received. The recess of the second cover supporting element may comprise a ring shaped groove. The ring shaped groove generally has a rectangular shape and may be complementary to the shape of the first cover supporting element.

Having a closed rim provides an additional barrier for adhesive flowing inward. In addition, having the ring shaped groove may aid in properly aligning the cover relative to the body of solidified molding compound.

What is claimed is:

1. A molded air-cavity package, comprising:
    a mounting substrate;
    a semiconductor die mounted on the mounting substrate;
    a plurality of package contacts, each package contact having a respective package contact end;
    a body of solidified molding compound, wherein the body comprises a lower part and an upper part that is integrally connected to the lower part, wherein the lower part is fixedly connected to the mounting substrate and the package contacts, and wherein the package contact end of each package contact is free of solidified molding compound and is electrically connected to the semiconductor die;
    a cover having a cover base and a cover sidewall protruding from an edge of the cover base towards the upper part, wherein the cover sidewall is fixedly connected to the upper part using an adhesive, wherein the cover, body, and mounting substrate define an air cavity, and wherein the lower part has an inner region and an outer region relative to a center of the package; and
    a plurality of separate first cover supporting elements being formed in one of the inner region and the cover base and a plurality of separate second cover supporting elements being formed in an other of the inner region and the cover base, wherein each first cover supporting element extends towards and abuts a respective second cover supporting element, thereby forming a respective pillar arranged spaced apart from the upper part and cover sidewall.

2. The molded air-cavity package according to claim 1, wherein a surface of the upper part directed towards the cover sidewall and a surface of the cover sidewall directed towards the upper part together define a channel in which the adhesive is arranged, wherein the channel starts in the cavity and exits on an outer surface of the package, wherein the adhesive blocks the channel, thereby providing an airtight seal of the package, and wherein the channel, when seen from inside the cavity, widens towards the exit of the channel.

3. The molded air-cavity package according to claim 1, wherein the cover is made from the same molding compound as the body, wherein the molding compound of the body comprises a thermo-set compound or a thermo-plast compound.

4. The molded air-cavity package according to claim 3, wherein the thermo-set compound comprises Duroplast.

5. The molded air-cavity package according to claim 3, wherein the thermo-plast compound comprises liquid crystal polymers.

6. The molded air-cavity package according to claim 1,
wherein the body fixates the plurality of package contacts relative to the mounting substrate in a spaced apart manner, thereby electrically isolating the plurality of package contacts from the mounting substrate, and wherein the upper part forms a ring that is integrally connected to the outer region of the lower part,
wherein the package contacts each comprise a lead and the package contact ends each comprise a lead end,
wherein the plurality of leads extend through the body of solidified molding compound,
wherein each lead end is supported on or embedded in a supporting surface of the inner region of the lower part,
wherein the molded air-cavity package further comprises bondwires for connecting the lead ends to the semiconductor die,
wherein the supporting surface comprises, for each lead, a recess in which the respective lead is at least partially accommodated,
wherein an upper surface of each lead lies in plane with a remainder of the supporting surface, and
wherein the plurality of separate first cover supporting elements are formed in one of the supporting surface of the inner region and the cover base and the plurality of separate second cover supporting elements being formed in an other of the supporting surface of the inner region and the cover base.

7. The molded air-cavity package according to claim 6,
wherein at least one of the first cover supporting elements is formed in the supporting surface of the inner region and is integrally connected to the body and the corresponding second cover supporting element is formed in the cover base and is integrally connected thereto,
wherein the cover base has a quadrangle shape,
wherein some of the second cover supporting elements are formed in respective corners of the cover base spaced apart from the sidewall, and
wherein the plurality of second cover supporting elements comprises three second cover supporting elements or four second cover supporting elements, each arranged in a respective corner of the cover base.

8. The molded air-cavity package according to claim 6,
wherein at least one of the second cover supporting elements is formed in the supporting surface of the inner region and is integrally connected to the body and the corresponding first cover supporting element is formed in the cover base and is integrally connected thereto,
wherein the cover base has a quadrangle shape,
wherein some of the first cover supporting elements are formed in respective corners of the cover base spaced apart from the sidewall, and
wherein the plurality of first cover supporting elements comprises three first cover supporting elements or four first cover supporting elements, each arranged in a respective corner of the cover base.

9. The molded air-cavity package according to claim 6, wherein each second cover supporting element is formed by a non-recessed and non-protruding region of the supporting surface of the inner region or by a non-recessed and non-protruding region of the cover base, and wherein the non-recessed and non-protruding region is flat.

10. The molded air-cavity package according to claim 6, wherein the package contacts each comprise a signal pad of which an inward surface forms a respective package contact end, wherein the molded air-cavity package further comprises bondwires for connecting the inward surfaces of the signal pads to the semiconductor die, and wherein the molded air-cavity is a quad flat no-lead package, a power quad flat no-lead package, or a dual flat no-lead package.

11. The molded-air cavity package according to claim 1, wherein the mounting substrate comprises:
a die-pad; or
a heat-conducting substrate, wherein:
the semiconductor die comprises a conductive silicon substrate on which a laterally diffused metal-oxide-semiconductor ("LDMOS") transistor is arranged and grounding of the LDMOS transistor is achieved through the silicon substrate and through the heat-conducting substrate; or
the semiconductor comprises a insulating gallium nitride substrate on which a field-effect transistor ("FET") is arranged and grounding of the FET is achieved through vias in the gallium nitride substrate and through the heat-conducting substrate.

12. The molded air-cavity package according to claim 6, wherein the molded air-cavity package is a land grid array package, wherein the mounting substrate comprises a printed circuit board, wherein the package contacts each comprise a respective land formed on an outside surface of the printed circuit board, wherein the package contacts each further comprises a pad formed on an inside surface of the printed circuit board that forms a respective package contact end, wherein the semiconductor die is flip-chipped onto the printed circuit board using the pads formed on the inside surface of the printed circuit board, and wherein the molded-air cavity package further comprises bondwires for connecting the package contact ends to the semiconductor die.

13. The molded air-cavity package according to claim 1, wherein each second cover supporting element extends towards and abuts a respective first cover supporting element for together forming a respective pillar.

14. The molded air-cavity package according to claim 1, wherein each second cover supporting element comprises a recess in which the corresponding first cover supporting element is received.

15. The molded air-cavity package according to claim 14,
wherein the plurality of second cover supporting elements comprises at least three second cover supporting elements, and
wherein:
a shape of the recess of two among the at least three second cover supporting elements limits relative movement between the cover and body to mutually different directions parallel to the mounting substrate during placement of the cover on the body, wherein the recesses of the second cover supporting elements comprise a groove or an elongated slot; or
a recess of two among the at least three second cover supporting elements has a shape that is complementary to the shape of the corresponding first cover supporting element such that relative movement between the cover and body was limited in all directions parallel to the mounting substrate during placement of the cover on the body.

16. The molded air-cavity package according to claim 1, wherein an upper surface of the upper part comprises one or more first alignment structures, wherein a lower surface of the cover sidewall comprises one or more second alignment structures, and wherein the first and second alignment structures are configured to cooperate during placement of the cover on the body for urging the cover and the body to mutually move towards a position in which the first and second cover supporting elements abut each other.

17. An electronic device comprising the molded air-cavity package according to claim 1.

* * * * *